(12) United States Patent
Werner et al.

(10) Patent No.: US 12,276,693 B2
(45) Date of Patent: Apr. 15, 2025

(54) ELECTRONIC COMPONENT HANDLING APPARATUS, ELECTRONIC COMPONENT TESTING APPARATUS, ELECTRONIC COMPONENT TESTING METHOD

(71) Applicant: ADVANTEST Corporation, Tokyo (JP)

(72) Inventors: Matthias Werner, Boeblingen (DE); Takashi Hashimoto, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 181 days.

(21) Appl. No.: 18/036,821

(22) PCT Filed: Nov. 30, 2020

(86) PCT No.: PCT/EP2020/083827
§ 371 (c)(1),
(2) Date: May 12, 2023

(87) PCT Pub. No.: WO2022/111821
PCT Pub. Date: Jun. 2, 2022

(65) Prior Publication Data
US 2023/0417826 A1    Dec. 28, 2023

(51) Int. Cl.
G01R 31/28      (2006.01)
G01R 35/00      (2006.01)

(52) U.S. Cl.
CPC ..... G01R 31/2867 (2013.01); G01R 31/2875 (2013.01); G01R 31/2877 (2013.01); G01R 35/005 (2013.01)

(58) Field of Classification Search
CPC ............ G01R 31/2874; G01R 31/2875; G01R 31/2877
See application file for complete search history.

(56) References Cited

U.S. PATENT DOCUMENTS 5,307,011 A * 4/1994 Tani ................. B07C 5/344
                                                324/757.04
6,104,183 A * 8/2000 Kobayashi ......... G01R 31/2868
                                                324/757.04
(Continued)

FOREIGN PATENT DOCUMENTS

CN    101248361 A    8/2008
CN    109580991 A    4/2019
(Continued)

OTHER PUBLICATIONS

Office Action issued in Taiwanese Application No. 11121178140; Dated Nov. 29, 2022 (9 pages).
(Continued)

Primary Examiner — Tung X Nguyen
(74) Attorney, Agent, or Firm — Osha Bergman Watanabe & Burton LLP

(57) ABSTRACT

An electronic component handling apparatus pressing the DUT against a socket electrically connected to a tester, includes: a first receiver that receives, from the tester, a first signal indicating a detection value of a temperature detection circuit; a calculator that calculates a temperature of the DUT based on the first signal; a calibrator that calibrates the calculated temperature; a second receiver that receives, from the tester, a second signal that causes the calibrator to start a first calibration; and a temperature adjuster that adjusts the temperature of the DUT. The second receiver receives the second signal before the tester turns on the DUT, once the second signal is received, the calibrator calculates a first calibrated temperature by executing the first calibration with respect to the calculated temperature, and the temperature adjuster adjusts the temperature of the DUT based on the first calibrated temperature.

16 Claims, 4 Drawing Sheets

(56) References Cited

U.S. PATENT DOCUMENTS

| | | | |
|---|---|---|---|
| 7,768,286 B2 | 8/2010 | Hosoda et al. | |
| 2005/0271115 A1 | 12/2005 | Takeuchi | |
| 2008/0259990 A1 | 10/2008 | Takeuchi | |
| 2009/0051381 A1* | 2/2009 | Hosoda | G01R 1/0458 |
| | | | 324/750.02 |
| 2011/0126931 A1 | 6/2011 | Ide et al. | |
| 2015/0268295 A1 | 9/2015 | Sasaki et al. | |
| 2019/0086468 A1 | 3/2019 | Yoshino et al. | |
| 2019/0101587 A1 | 4/2019 | Watanabe | |
| 2020/0033402 A1 | 1/2020 | Hashimoto et al. | |
| 2020/0241040 A1 | 7/2020 | Yoshino et al. | |
| 2020/0241582 A1 | 7/2020 | Sasaki | |

FOREIGN PATENT DOCUMENTS

| | | |
|---|---|---|
| CN | 110763976 A | 2/2020 |
| JP | 2005-345426 A | 12/2005 |
| TW | 200720681 A | 6/2007 |

OTHER PUBLICATIONS

International Search Report issued in corresponding International Application No. PCT/EP2020/083827 mailed Aug. 16, 2021 (5 pages).

Written Opinion issued in corresponding International Application No. PCT/EP2020/083827 mailed Aug. 16, 2021 (10 pages).

\* cited by examiner

ELECTRONIC COMPONENT HANDLING APPARATUS, ELECTRONIC COMPONENT TESTING APPARATUS, ELECTRONIC COMPONENT TESTING METHOD

BACKGROUND

Technical Field

The present invention relates to an electronic component handling apparatus, an electronic component testing apparatus, an electronic component testing method, using for a test of DUT (Device Under Test) such as a semiconductor integrated circuit device.

Description of Related Art

Some semiconductor chips are provided with a temperature sensor circuit for measuring a temperature of the semiconductor chip. A detected temperature of the temperature sensor circuit has a variation under the influence of variations in a manufacturing process of the temperature sensor circuit. To eliminate such variations, for each temperature sensor, the resistance value of the variable resistor constituting the temperature sensor circuit is calibrated so that the desired temperature is detected by fine adjustment (trimming) (for example, see in Patent Document 1).

PATENT DOCUMENT

Patent Document 1: JP 2005-345426 A

During DUT test, the temperature of the DUT needs to be measured in order to accurately set the temperature of the DUT. In this case, it is necessary to calibrate the temperature sensor circuit. However, in the temperature calibration by trimming as described above, a long working time may be required in the trimming process.

SUMMARY

One or more embodiments of the present invention provide an electronic component handling apparatus, an electronic component testing device including the same, and an electronic component testing method, which eliminate the need for a trimming process.

[1] An aspect of the present invention provides an electronic component handling apparatus for handling a DUT having a temperature detection circuit and pressing the DUT against a socket electrically connected to a tester testing the DUT, comprising a first receiver receiving a first signal representing a detection value of the temperature detection circuit from the tester, a calculator calculating a temperature of the DUT based on the first signal and obtaining a calculated temperature, a calibrator calibrating a calculated temperature calculated by the calculator, a second receiver receiving a second signal making the calibrator start the first calibration from the tester, and a temperature adjuster adjusting the temperature of the DUT. The second receiver receives the second signal before the tester turns on the DUT, the calibrator calculates a first calibrated temperature by executing the first calibration with respect to the calculated temperature from the time (once) the second receiver receives the second signal, and the temperature adjuster adjusting the temperature of the DUT based on the first calibrated temperature.

[2] In the above aspect of the present invention, an electronic component handling apparatus may further comprise a fourth transmitter capable of transmitting a start signal to the tester for making the tester start test of the DUT, and the second receiver may receive the second signal after the start signal is transmitted to the tester.

[3] In the above aspect of the present invention, the second receiver may receive the second signals after the tester starts test of the DUT.

[4] In the above aspect of the present invention, the second signals may be transmitted from the tester to the second receiver based on an external output trigger incorporated in a test program executed by the tester.

[5] In the above aspect of the present invention, the electronic component handling apparatus may further comprise a third receiver receiving a third signal from the tester. The third signal makes the calibrator start a second calibration that is different from the first calibration. The third receiver may receive the third signal immediately after the tester turns on the DUT, the calibrator may calculate a second calibrated temperature by executing the second calibration with respect to the calculated temperature from the time (once) the third receiver receives the third signal, and the temperature adjuster may adjust the temperature of the DUT based on the second calibrated temperature.

[6] In the above aspect of the present invention, the temperature adjuster may adjust the temperature of the DUT so that the temperature of the DUT becomes the target temperature before the second receiver receives the second signal.

[7] In the above aspect of the present invention, the temperature adjuster may adjust the temperature of the DUT in predetermined time so that the temperature of the DUT becomes the target temperature before the second receiver receives the second signal.

[8] In the above aspect of the present invention, the temperature detection circuit may include a diode.

[9] In the above aspect of the present invention, the electronic component handling apparatus may sequentially supply the DUT to the socket, and the calibrator may execute the first calibration for all DUTs respectively.

[10] In the above aspect of the present invention, the electronic component handling apparatus may sequentially supply the DUT to the socket, and the calibrator may execute the first and second calibration for all DUTs respectively.

[11] In the above aspect of the present invention, the calibrator may further include a storage unit (i.e., a storage) storing the calculated temperature, the storage unit may store a calculated temperature $T_o$ at which the second receiver receives the second signal, and the calibrator may execute the first calibration based on the calculated temperature $T_o$.

[12] In the above aspect of the present invention, the calibrator may further include a storage unit (i.e., a storage) storing the calculated temperature, the storage unit may store a calculated temperature $T_o$ at which the second receiver receives the second signal, the calibrator may execute the first calibration based on the calculated temperature $T_o$, the storage unit may store a calculated temperature $T_1$ at which the third receiver receives the third signal, and the calibrator may execute the second calibration based on the calculated temperature $T_1$.

[13] In the above aspect of the present invention, the temperature adjuster may be a thermostatic chamber configured to accommodate the DUT and adjust an inner temperature, the temperature adjuster may adjust the inner temperature so that the temperature of the DUT reaches a set point before the second receiver receives the second signal, and the set point may be a target temperature of the DUT under a test.

[14] In the above aspect of the present invention, the thermostatic chamber may adjust the inner temperature in predetermined time so that the temperature of the DUT is a set point before the second receiver receives the second signal.

[15] In the above aspect of the present invention, the electronic component handling apparatus may further comprise a contact arm bringing the DUT into contact with the socket, a pusher provided on a tip end of the contact arm and press the DUT against the socket, a temperature sensor provided in the pusher and measuring the temperature of the DUT through the pusher. The temperature adjuster may adjust the temperature of the DUT by adjusting a temperature of the pusher.

[16] In the aspect of the present invention, the temperature adjuster may adjust the temperature of the DUT after the pusher contacts the DUT and before the second receiver receives the second signal.

[17] In the above aspect of the present invention, the first calibration may be executed based on the following formulas (1) and (2):

$$T'(t) = T_{ref} + \Delta T_1 \tag{1}$$

$$\Delta T_1 = T(t) - T_0 \tag{2}$$

where T'(t) is the first calibrated temperature, $T_{ref}$ is a reference temperature, T(t) is the calculated temperature in t second from a time that the second receiver receives the second signal, and $T_0$ is the calculated temperature calculated by the calculator when the second receiver receives the second signal.

[18] In the above aspect of the present invention, the second calibration may be executed based on the following formulas (3) to (5).

$$T''(t) = T_{ref} + \Delta T_1 + \Delta T_2 \tag{3}$$

$$\Delta T_1 = T(t) - T_0 \tag{4}$$

$$\Delta T_2 = T_0 - T_1 \tag{5}$$

where T''(t) is the second calibrated temperature, $T_{ref}$ is a reference temperature, T(t) is the calculated temperature in t second from a time that the second receiver receives the second signal, $T_0$ is the calculated temperature calculated by the calculator when the second receiver receives the second signal, and $T_1$ is the calculated temperature calculated by the calculator when the third receiver receives the third signal.

[19] In the above aspect of the present invention, the reference temperature is the set point or a temperature of the DUT measured by the temperature sensor.

[20] An aspect of the present invention provides an electronic component testing apparatus comprising the above electronic component handling apparatus, and a tester testing the DUT. The tester includes a first transmitter configured to transmit the first signal, and a second transmitter configured to transmit the second signal before the DUT is turned on.

[21] An aspect of the present invention provides an electronic component testing apparatus comprising the above electronic component handling apparatus, and a tester testing the DUT. The tester includes a first transmitter configured to transmit the first signal, a second transmitter configured to transmit the second signal before the DUT is turned on, and a third transmitter configured to transmit the third signal immediately after the DUT is turned on.

[22] In the above aspect of the present invention, the electronic component handling apparatus may further comprise a forth transmitter configured to transmit a start signal to the tester. The start signal may make the tester start a test of the DUT, and the second receiver may receive the second signal after the start signal is transmitted to the tester.

[23] In the above aspect of the present invention, the second transmitter may transmit the second signal after the tester starts the test of the DUT.

[24] In the above aspect of the present invention, the tester may transmit the second signals from the second transmitter to the second receiver based on an external output trigger incorporated in the test program executed by the tester.

[25] An aspect of the present invention provides an electronic component testing method for testing a DUT having a temperature detection circuit by a tester comprises a first step of calculating a temperature of the DUT based on a detection value of the temperature detection circuit and obtaining a calculated temperature, a second step of calculating a first calibrated temperature by executing a first calibration with respect to the calculated temperature before the tester turns on the DUT and a third step of adjusting the temperature of the DUT based on the first calibrated temperature.

[26] In the above aspect of the present invention, the second step may be performed after the tester starts the test of the DUT.

[27] In the above aspect of the present invention, the electronic component testing method may further comprises a forth step of calculating a second calibrated temperature by executing a second calibration with respect to the calculated temperature immediately after the tester turns on the DUT, and a fifth step of adjusting the temperature of the DUT based on the second calibrated temperature. The second calibration may be different from the first calibration.

In one or more embodiments of the present invention, the above trimming process is not required because the electronic component handling apparatus calibrates the calculated temperature calculated by the calculator in the test of the DUT.

DETAILED DESCRIPTION

Hereinafter, embodiments of the present invention will be described with reference to the drawings.

The First Embodiment

Figure 1:
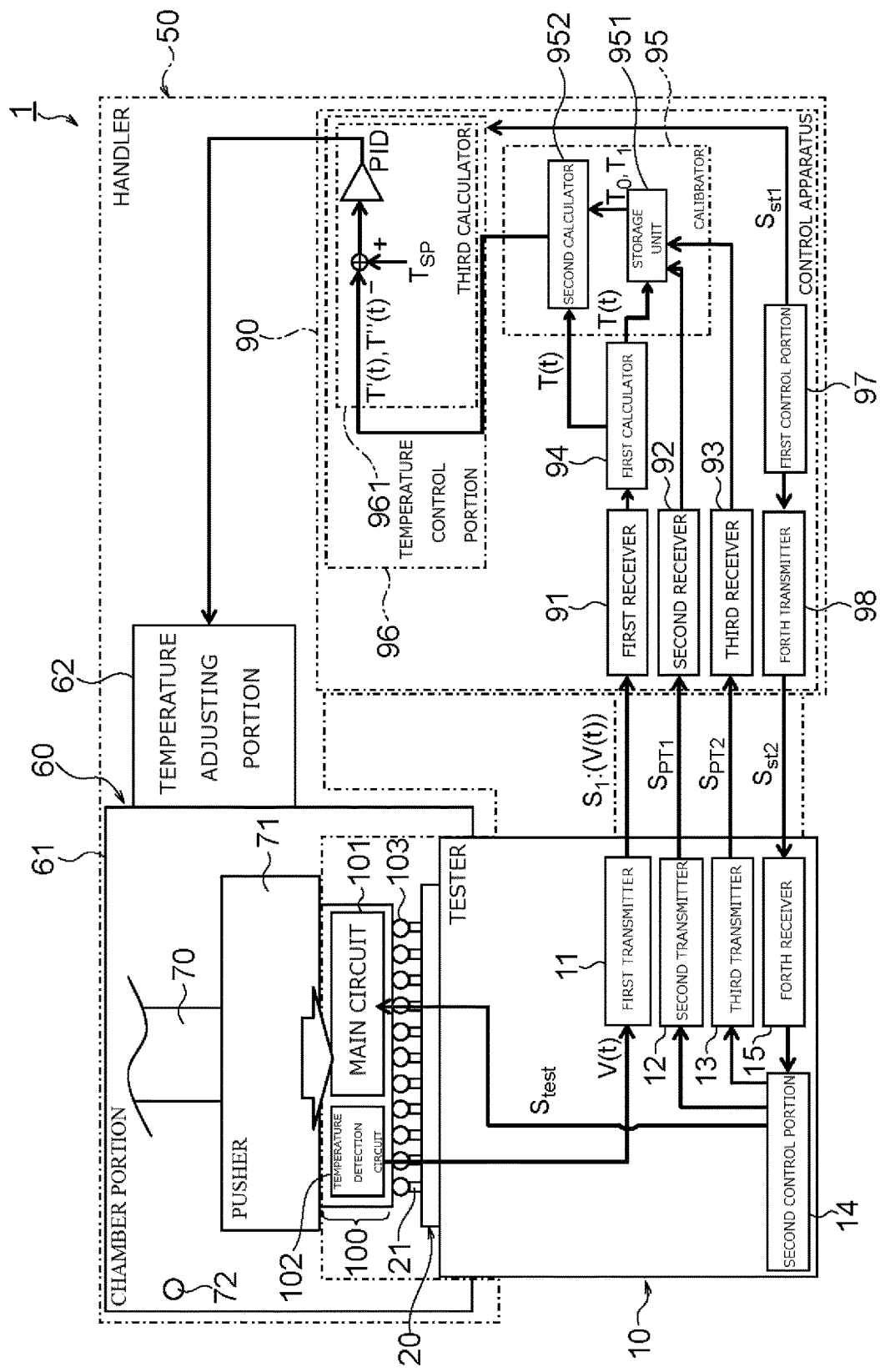
FIG. 1 is a block diagram illustrating a configuration of a first electronic component testing apparatus in a first embodiment of the present invention.
Figure 2:
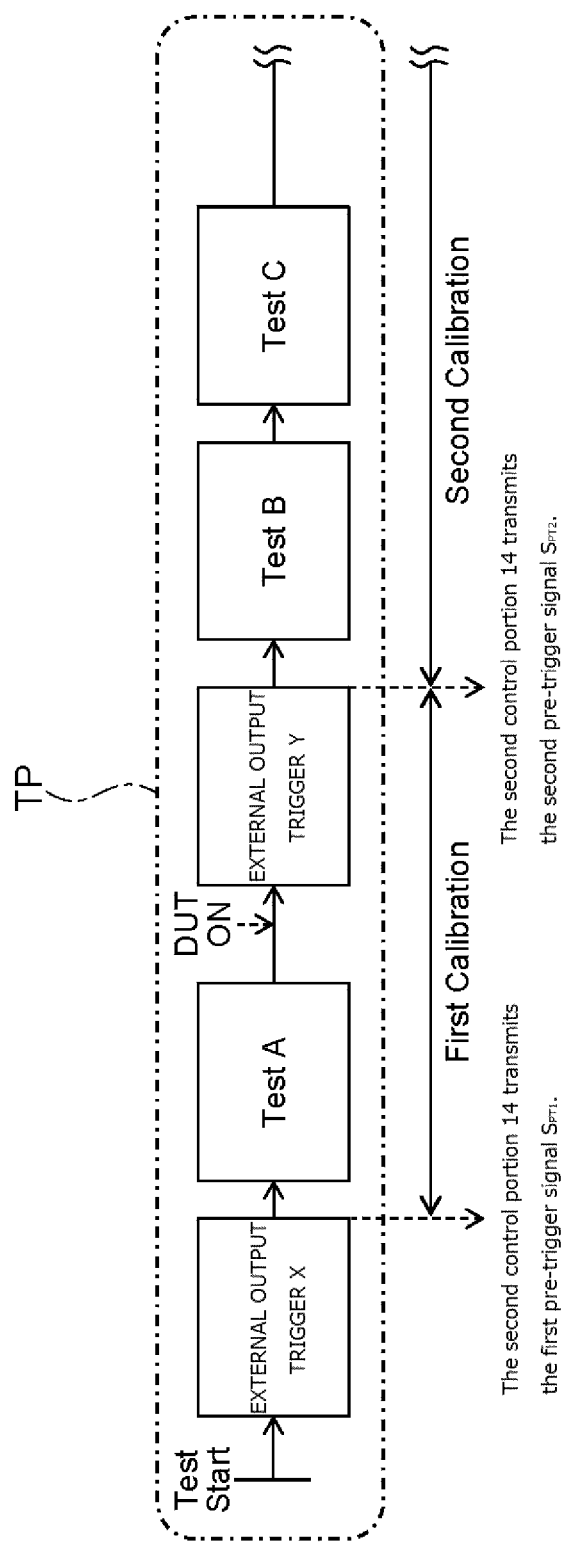
FIG. 2 is a flowchart showing a test program in the first embodiment of present invention.
Figure 3:
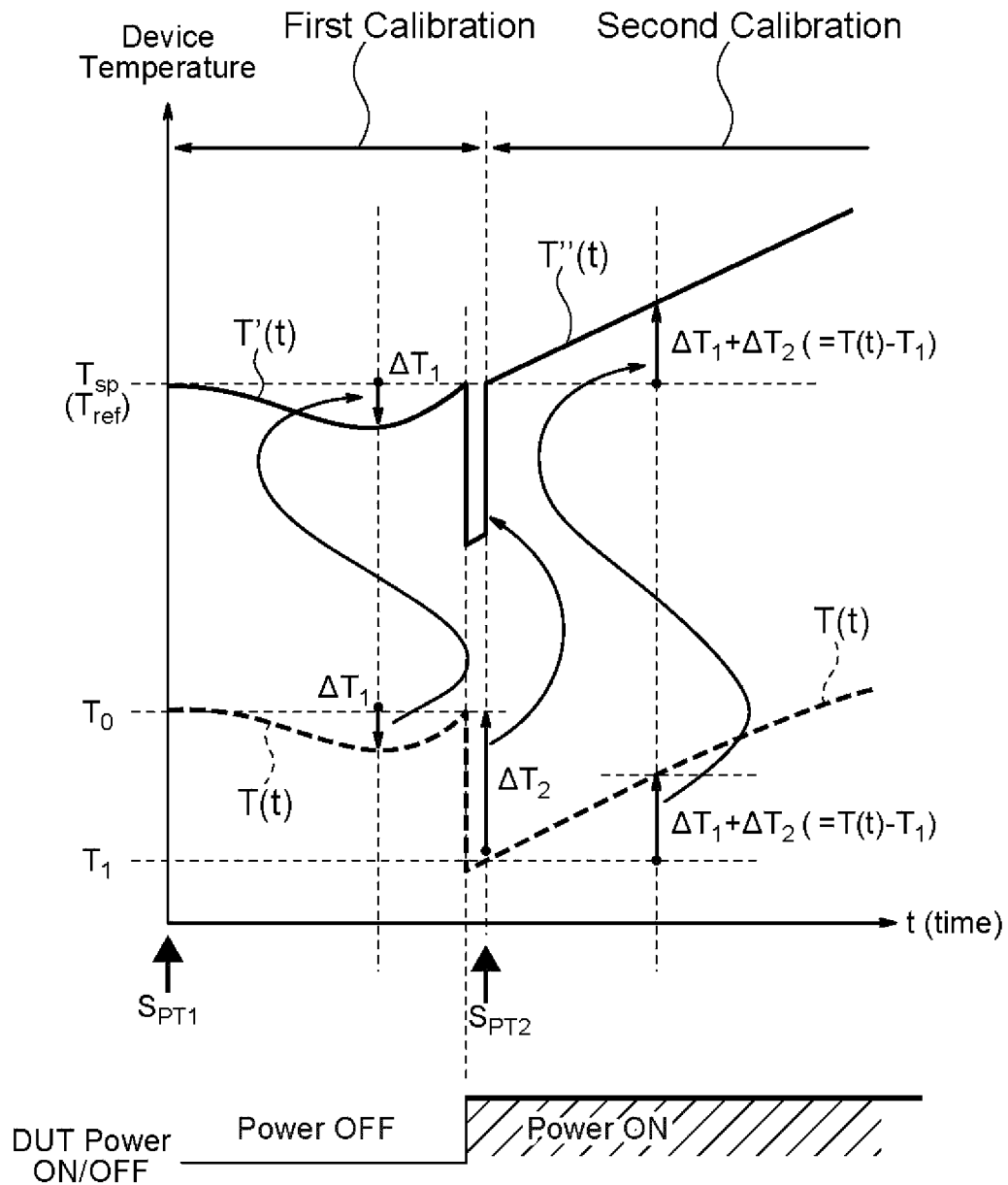
FIG. 3 is a graph explaining first and second calibrations in the first embodiment of the present invention.

FIG. 1 is a block diagram showing a configuration of an electronic component testing apparatus in the first embodiment, FIG. 2 is a flowchart showing a test program in the first embodiment of present invention, FIG. 3 is a graph explaining first and second calibrations in the first embodiment of the present invention.

The electronic component testing apparatus 1 in the present embodiment is an apparatus for testing electrical characteristics of a DUT 100 such as a semiconductor integrated circuit device. As a specific example of the DUT 100 to be tested, logic devices such as CPUs (Central Processing Unit) and GPUs (Graphics Processing Unit) can be exemplified. The DUT 100 to be tested by the electronic component testing apparatus 1 is not particularly limited to the above. The DUT 100 may be, for example, an electronic component, a SoC (System on a chip), or a memory-based device.

As shown in FIG. 1, the DUT 100 in the present embodiment includes the main circuit 101 that is a test object of the tester 10, and a temperature detection circuit 102 that detects the temperature of the DUT 100. The temperature detection circuit 102 in the present embodiment is, for example, a circuit including a thermal diode, and is formed on a semiconductor substrate on which the main circuit 101 is formed. This temperature detection circuit 102 has the property that the forward voltage drop of the PN junction changes with temperature (temperature dependency), and the temperature of the DUT 100 can be detected by utilizing this temperature dependency. The temperature detection circuit 102 may include a band gap sensor, an integrated circuit temperature sensor, a temperature measuring resistor, a thermocouple, and the like instead of the thermal diodes.

As shown in FIG. 1, the electronic component testing apparatus 1 in the present embodiment comprises a tester 10 and an electronic component handling apparatus 50 (hereinafter simply referred to as a handler 50).

A socket 20 is mounted on the tester 10. When the DUT 100 is pressed against the socket 20 by the handler 50, the DUT 100 is electrically connected to the tester 10 through the socket 20. Then, the tester 10 executes a test program(s) to perform the test of the DUT 100. Specifically, the tester 10 performs the test of the DUT 100 by inputting and outputting test signals to the main circuit 101 of the DUT 100 via the socket 20. The detected voltage signal of the temperature detection circuit 102 of the DUT 100 is taken into the tester 10 via the socket 20. Although not particularly limited, the tester 10 includes, for example, a load board on which the socket 20 is mounted, a test head on which the load board is mounted, and a main frame (tester body) electrically connected to the test head.

The handler 50 is an apparatus for handling the DUT 100, and is configured to supply and press the DUT 100 to the socket 20 before starting the test, and to sort the DUT 100 after the test according to a test result. The tester 10 and the handler 50 are connected via a cable 30, and signals can be exchanged between the tester 10 and the handler 50. Incidentally, the tester 10 and the handler 50 may perform transmission and reception of signals using optical wireless communication using an infrared or the like. In this case, cable 30 may be omitted. In addition, the tester 10 and the handler 50 may transmit and receive signals by using a digital communication such as Rs232C, SPI, and I2C, or high-speed digital communication such as LAN. As a communication method of the LAN, for example, a wired LAN such as a Ethernet, or a wireless LAN such as a Wi-Fi can be used.

A socket 20 is mounted on the tester 10. The socket 20 has contacts 21 disposed so as to correspond to the input and output terminals 103 of the DUT 100. After a contact arm 70 of the handler 50 brings the DUT 100 into contact with the socket 20, a pusher 71 pushes the DUT 100 toward the socket 20, thereby the input and output terminals 103 of the DUT 100 come into contact with contacts 21 of the socket 20. As a result, the DUT 100 is electrically connected to the sockets 20.

As shown in FIG. 1, the tester 10 includes a first transmitter 11, a second transmitter 12, a third transmitter 13, a second control portion 14 that may comprise a CPU (Central Processing Unit), and a fourth receiver 15.

The first transmitter 11 receives a detection value of the temperature detection circuit 102, and transmits the first signal $S_1$ indicating the detection value to the first receiver 91 of the handler 50 as the analogue signal. In this embodiment, the detected value is the output voltage V (t) of the thermal diode included in the temperature detection circuit 102. Note that the first signal $S_1$ may not be an analogue signal, but may be a digital signal.

The second transmitter 12 receives a first pre-trigger signal $S_{PT1}$ transmitted from the second control portion 14, and transmits the first pre-trigger signal $S_{PT1}$ to the second receiver 92 of the handler 50. The first pre-trigger signal $S_{PT1}$ is a trigger signal for making a calibrator 95 of the handler 50 execute a first calibration. The detected value of the temperature detection circuit 102 received by the first transmitter 11 includes errors with respect to the actual temperature of the DUT 100 due to variations in the manufacturing process of the temperature detection circuit 102, etc. The first pre-trigger signals $S_{PT1}$ makes the calibrator 95 of the handler 50 execute the first calibration that corrects for a first error caused by the individuality of the temperature detection circuit 102. The first pre-trigger signal $S_{PT1}$ corresponds to an exemplary "second signal" in the present embodiment.

In the present embodiment, the first pre-trigger signal $S_{PT1}$ is transmitted from the second control portion 14 after the test of the DUT 100 is started and before the tester 10 turns on the DUT 100. Alternatively, the first pre-trigger signal $S_{PT1}$ may be transmitted from the second control unit 18 at the same time as the test of the DUT 100 starts.

By executing the first calibrating after the test of the DUT 100 starts and before the tester 10 turns on the DUT 100, the temperature of the DUT 100 can be accurately grasped even during the test performed by the tester 10 when the DUT 100 is power off (when the main circuit 101 is power off), such as the time when the connection test is performed. Therefore, it is possible to perform the connection test or the like of the DUT 100 at appropriate temperatures.

The third transmitter 13 receives the second pre-trigger signal $S_{PT2}$ transmitted from the second control portion 14, and transmits the second pre-trigger signal $S_{PT2}$ to the third receiver 93 of the handler 50. The second pre-trigger signal $S_{PT2}$ is a trigger signal for making the calibrator 95 of the handler 50 execute the second calibration. In the test of the DUT 100, when the DUT 100 is turned on (when the test of the electric properties of the DUT 100 is started), the detected value of the temperature detection circuit 102 is varied due to leakage current or the like in the circuit formed in the DUT 100. Therefore, an error occurs between the detected value and the actual temperature of the DUT 100. The second pre-trigger signals $S_{PT2}$ makes the calibrator 95 of the handler 50 execute a second calibration that corrects the first error and a second error that is occurred between OFF/ON of the power of the DUT 100. This second calibration is a calibration that differs from the first calibration, and in this embodiment, the calibrator 95 switches the first calibration to the second calibration when the third receiver 93 receives the second pre-trigger signal $S_{PT2}$. The second pre-trigger signal $S_{PT2}$ corresponds to an exemplary "third signal" in the present embodiment.

In the present embodiment, the second pre-trigger signal $S_{PT2}$ is transmitted from the second control portion 14 immediately after the tester 10 turns on the DUT 100. It should be noted that the term "immediately after the tester 10 turns on the DUT 100" as used herein means an extremely short period from the time when the DUT 100 is turned on to the time when the DUT 100 starts self-heating. Specifically, the extremely short period is one second or less from the time when the DUT 100 is turned on. In one or more embodiments, the second control unit 18 may transmit the second pre-trigger signal $S_{PT2}$ within 0.2 seconds from the time when the DUT 100 is turned on.

By executing the second calibration, the temperature of the DUT 100 can be accurately grasped even during the test performed by the tester 10 after the DUT 100 is turned on.

After receiving the test start signal $S_{st2}$ transmitted from the handler the second control portion 14 transmits the test signal $S_{test}$ to the DUT 100. In response to the test signals $S_{test}$, the second control portion 14 operates the DUT 100 based on the test program of the tester 10. The second control portion 14 can output the first pre-trigger signal $S_{TP1}$ or the second pre-trigger signal $S_{PT2}$ based on an external output trigger incorporated in the test program of the tester 10.

FIG. 2 is a flowchart showing a test program in the first embodiment. The test program TP of the present embodiment includes, but is not limited to, a test A, a test B, and a test C. The test A is a test performed prior to turning on the DUT 100, and is, for example, a connection test or the like. On the other hand, the test B and the test C are a test to be executed after the DUT 100 is turned on. The tests A and B are, for example, a function test, a DC test, a scan test, and power supply current test (power consumption test) and the like.

The test program TP incorporates an external output trigger X at a position before executing the test A. The external output trigger X is a trigger for making the second control portion 14 transmit the first pre-trigger signal Sm. Further, an external output trigger Y is incorporated in the test program TP at a position immediately after the DUT 100 is turned on. The external output trigger Y is a trigger for making the second control portion 14 transmit the second pre-trigger signal $S_{PT2}$. The test program TP also includes a trigger for transmitting a switching signal of ON/OFF of the DUT 100. As an example of the second control portion 14, a workstation can be exemplified.

As shown in FIG. 1, the fourth receiver 15 receives the test start signal $S_{st2}$ transmitted from the handler 50, and transmits the test start signal $S_{st2}$ to the second control portion 14.

The handler 50 in this embodiment sequentially provides the DUT 100 to socket 20. The handler 50 includes a thermostatic chamber 60, a contact arm 70, a pusher 71, a temperature sensor 72, and a control apparatus 90.

The thermostatic chamber 60 includes a chamber portion 61 and a temperature adjusting portion 62. The DUT 100 is accommodated in the chamber portion 61. The temperature adjusting portion 62 is connected to the chamber portion 61. The temperature adjusting portion 62 includes a heating device and a cooling device. The thermostatic chamber 60 is configured to adjust the internal temperature of the chamber portion 61 (ambient temperature), thereby the thermostatic chamber 60 is able to adjust the temperature of the DUT 100. Although not particularly limited, a heater or a hot air supply device are exemplified as a specific example of the heating device of the temperature adjusting portion 62. Although not particularly limited, a refrigerant supply device for supplying liquid nitrogen is exemplified as a specific example of the cooling device of the temperature adjusting portion 62, for example, can be exemplified. The temperature adjusting portion 62 can adjust the internal temperature of the chamber portion 61 by adjusting the supply amount of hot air or liquid nitrogen.

The thermostatic chamber 60 can adjust the interior temperatures of the chamber portion 61 to a set point. Thus, the thermostatic chamber 60 can adjust the temperature of the DUT 100 accommodated in the chamber portion 61 to the set point. The set point is the target temperature of the DUT 100 at the time of the test. The set point may have been previously input to the tester 10, for example, and the handler 50 may adjust the temperature of the DUT 100 to the set point based on the input data. Alternatively, the set point may have been previously entered into the handler 50 by the operator. Incidentally, the internal temperature of the chamber portion 61 may be adjusted to the set point by controlling the temperature adjusting portion 62 so that the difference between the detected value and the set point of the temperature sensor 72 is minimized by using a temperature control portion (or a temperature controller) 96.

The contact arm 70 is a apparatus for moving the DUT 100, supported by rails (not shown) provided in the handler 50. The contact arm 70 includes an actuator for horizontal movement (not shown) and can move back, forth, left, and right according to the rail. Further, the contact arm 70 includes an actuator for vertical drive (not shown) and can move in the vertical direction.

The pusher 71 is provided at a tip end of the contact arm 70. The pusher 71 is in contact with the DUT 100, and presses the DUT 100 toward the socket 20 to electrically connect the DUT 100 and the socket 20.

The control apparatus 90 includes a first receiver 91, a second receiver 92, a third receiver 93, a first calculator 94, a calibrator 95, the temperature control portion 96, and a first control portion 97 that may comprise a CPU (Central Processing Unit).

The first receiver 91 receives a first signal $S_1$ from the first transmitter 11 of the tester 10. Here, the first signal $S_1$ indicates the detected value of the temperature detection circuit 102 (the output voltage V(t) of the thermal diode). The first receiver 91 transmits the received first signaling $S_1$ to the first calculator 94.

The first calculator 94 calculates the temperature T(t) of the DUT 100 based on the detected value indicated by the first signal $S_1$. The first calculator 94 outputs the calculated temperature T(t) to the calibrator 95. The calculated temperature T(t) prior to turning on the DUT 100 includes the first error due to variations in the manufacturing process of the temperature detection circuit 102, etc. On the other hand, the calculated temperature T(t) after the DUT 100 is turned on includes a second error due to the effect of the leakage current in addition to the first error described above.

The calibrator 95 calibrates the calculated temperature T(t) so as to correct the first and second errors as described above. The calibrator 95 includes a storage unit (or a storage) 951 and a second calculator 952.

The storage unit 951 is capable of storing the calculated temperature T(t) at a particular time received from the first calculator 94. More specifically, this storage unit 951 can store the calculated temperature $T_0$ when the second receiver 92 receives the first pre-trigger signal $S_{PT1}$ (hereinafter sometimes referred to as the first time point) and also the calculated temperature $T_1$ when the third receiver 93 receives the second pre-trigger signal $S_{PT2}$ (hereinafter sometimes referred to as the second time point). The storage unit 951 can transmit the calculated temperatures $T_0$ and $T_1$ to the second calculator 952, respectively.

The second calculator 952 receives a signal indicating the calculated temperature T(t) from the first calculator 94 and a signal indicating the above-described calculated temperatures $T_0$ and $T_1$ from the storage unit 951.

The second calculator 952 executes a first calibrating based on this calculated temperature $T_0$ when the second calculator 952 receive the signal indicating the calculated temperature $T_0$ from the storage unit 951. More specifically, the first calibrated temperature T'(t) is calculated by performing the first calibration based on the following formulas (6) and (7) with respect to the calculated temperature T(t).

$$T'(t)=T_{ref}+\Delta T_1 \quad (6)$$

$$\Delta T_1=T(t)-T_0 \quad (7)$$

Here, in the above formulas (6) and (7), T'(t) is the first calibrated temperature, $T_{ref}$ is the reference temperature, T(t) is the calculated temperature calculated by the first calculator 94 in t second from the first time point, $T_0$ is the calculated temperature calculated by the first calculator 94 at the first time point.

As the reference temperature $T_{ref}$ of the above equation (6), for example, the above-mentioned set point is used. Alternatively, when the temperature of the DUT 100 and the internal temperature of the chamber portion 61 is the same, the temperature detected by the temperature sensor 72 provided in the chamber portion 61 can also be used as the reference temperature.

The second calculator 952 also executes a second calibration based on this calculated temperature $T_1$ when the second calculator 952 receives a signal indicating the calculated temperature $T_1$ from storage unit 951. More specifically, the second calibrated temperature T''(t) is calculated by performing the second calibration based on the following formulas (8) to (10) with respect to the calculated temperature T(t).

$$T''(t)=T_{ref}+\Delta T_1+\Delta T_2 \quad (8)$$

$$\Delta T_1=T(t)-T_0 \quad (9)$$

$$\Delta T_2=T_0-T_1 \quad (10)$$

Here, in the above formulas (8) to (10), T''(t) is the second calibrated temperature, $T_{ref}$ is the reference temperature, T(t) is the calculated temperature calculated by the first calculator 94 in t second from the first time point, $T_0$ is the calculated temperature calculated by the first calculator 94 at the first time point, and $T_1$ is the calculated temperature calculated by the first calculator 94 at the second time point.

The first calibration and the second calibration in the present embodiment will now be described with reference to FIG. 3 as a specific example. FIG. 3 is a graph explaining first and second calibrations in the first embodiment. In the graph of FIG. 3, the solid line shows the first and second calibrated temperatures T'(t) and T''(t), the dashed line shows the calculated temperature T (t).

When the second receiver 92 receives the first pre-trigger signal $S_{PT1}$ (the first time point), the temperature of the DUT 100 has been adjusted by the thermostatic chamber 60 to the temperature of the set point $T_{sp}$. In addition, since the power of the DUT 100 is not turned on, the self-heating of the DUT 100 is not started. Therefore, in the first calibrating of FIG. 3, the setpoint $T_{sp}$ is used as the reference temperature $T_{ref}$, and the temperature of the DUT 100 at the first time point is regarded as the setpoint $T_{sp}$. In other words, at the first time point, the quantity of the error included in the calculated temperature T(t) caused by the manufacturing process of the DUT 100 is regarded as the difference between the setpoint $T_{sp}$ and the calculated temperature T(t), and the difference is added to the calculated temperature T(t) to correct the error (the first error described above).

Then, in the first calibration, as shown in the above formulas (6) and (7), the first calibrated temperature T'(t) is calculated by sequentially adding the change amount $\Delta T_1$ to this setpoint $T_{sp}$. Here, $\Delta T_1$ is the change amount of the calculated temperature from the first time point (the difference between T (t) and calculated temperature $T_0$). That is, in this first calibration, the calculated temperature T(t) is calibrated to the first calibrated temperature T'(t) by using calculated temperature $T_0$ of the first time point.

After a constant time has elapsed from the start of the test of the DUT 100, the DUT 100 is turned on. When the DUT 100 is turned on, since the value of the calculated temperature T(t) is varied due to leakage current or the like in the circuit formed in the DUT 100, the error occurs between the actual temperature of the DUT 100 and the calculated temperature T(t). For example, in the embodiment shown in FIG. 3, the value of the calculated temperature T(t) is reduced when the DUT 100 is turned on. The second calibration in the present embodiment corrects such a second error in addition to the first error.

Specifically, immediately after the tester 10 turns on the DUT 100 (when the third receiver 93 receives the second pre-trigger signal $S_{PT2}$ (the second time point)), the calibrator 95 calculates the second calibrated temperature T''(t) by executing the second calibration with respect to the calculated temperature T(t). In the second calibration, the difference $\Delta T_2$ between the calculated temperature $T_0$ calculated by the first calculator 94 at the first time point and the calculated temperature $T_1$ calculated by the first calculator 94 at the second time point is further added to the first calibration, as shown in formulas (8) to (10) above. The second error that occurs when the DUT 100 is turned on is corrected by adding the $\Delta T_2$ to T'(t). That is, in this second calibration, the calculated temperature T(t) is calibrated to the second calibrated temperature T''(t) by using the calculated temperature $T_1$ at the second time point. As described above, since the second pre-trigger signal $S_{PT2}$ is transmitted immediately after the DUT 100 is turned on and the self-heating of the DUT 100 has not started, even in this second calibration, the set point $T_{sp}$ is used as the reference temperature $T_{ref}$, and the temperature of the DUT 100 at the second time point can be regarded as the set point $T_{sp}$.

The temperature control portion 96 may perform temperature control based on the first calibrated temperature T'(t) or the second calibrated temperature T''(t) received from the calibrator 95. That is, the temperature control portion 96 executes the temperature control based on the first calibrated temperature T'(t) from the first time point, and executes the temperature control based on the second calibrated temperature T''(t) from the second time point.

As shown in FIG. 1, the temperature control portion 96 includes a third calculator 961. The third calculator 961 is connected to the calibrator 95. The third calculator 961 controls the temperature adjusting portion 62 of the thermostatic chamber 60 so that the difference between the first calibrated temperature T'(t) (or the second calibrated temperature T''(t)) inputted from the calibrator 95 and the set point $T_{SP}$ which is target temperature, is minimized. Specifically, the temperature adjusting portion 62 of the thermostatic chamber 60 adjusts the internal temperature of the chamber portion 61 based on the calibrated temperature, thereby the temperature of the DUT 100 is adjusted. As a specific control method executed by the third calculator 961, for example, PID (Proportional-Integral-Differential) control or the like can be exemplified.

Incidentally, when the internal temperature of the chamber portion 61 is adjusted to the set point before the test of the DUT 100 is started, the temperature control portion 96 may control the temperature adjusting portion 62 based on the detected value of the temperature sensor 72 provided inside the chamber portion 61. In this case, the temperature control portion 96 may control the temperature adjusting portion 62 of the thermostatic chamber 60 so that the difference between the detected value of the temperature sensor 72 and the set point $T_{SP}$ is minimized.

The first control portion 97 is configured to transmit the temperature control start signal $S_{st1}$ to the temperature control portion 96, and can also output the test start signal $S_{st2}$ to the second control portion 14 via the fourth transmitter 98. First, the first control portion 97 transmits the temperature control start signal $S_{st1}$ to the temperature control unit 96. Second, by the temperature control unit 96 controls the temperature adjusting unit 62, the internal temperature of the chamber portion 61 is adjusted to the set point. Then, the first control portion 97 transmits the test start signal $S_{st2}$ to the second control portion 14 via the fourth transmitter 98 and the fourth receiver 15 after the internal temperature is adjusted to the set point.

It will be described below the operation of the electronic component testing apparatus 1 in this embodiment.

When the DUT 100 is placed on the socket 20 by the contact arm 70 of the handler 50, the DUT 100 is pressed against the socket 20 by the pusher 71, thereby the DUT 100 and the socket 20 are electrically connected.

Then, the first control portion 97 of the handler 50 transmits the temperature control start signal $S_{st1}$ to the temperature control portion 96. The temperature control portion 96 controls the temperature adjusting portion 62 of the thermostatic chamber 60 based on the temperature control start signals Sstl, and the temperature adjustment of the DUT 100 is started. The temperature in the thermostatic chamber 60 is adjusted to the setpoint by heating or cooling the atmosphere in the thermostatic chamber 60. Since the DUT 100 is accommodated in the thermostatic chamber 60, the DUT 100 is also heated or cooled by the atmosphere and the temperature of the DUT 100 is also adjusted to the set point. For example, the temperature of the DUT 100 can be adjust to the set point by setting the temperature inside the thermostatic chamber 60 to the set point and then leaving the DUT 100 for a predetermined time (adjusting the temperature for a predetermined time). Here, the predetermined time is not particularly limited as long as the temperature of the DUT 100 in the thermostatic chamber 60 becomes a set point. For example, a predetermined time may be 1 minute to 10 minutes.

Next, the test start signal $S_{st2}$ is transmitted from the first control portion 97 of the handler 50 to the fourth transmitter 98, and the fourth transmitter 98 transmits the test start signal $S_{st2}$ to the fourth receiver 15. The fourth receiver 15 transmits the test start signal $S_{st2}$ to the second control portion 14, and the second control portion 14 executes the test program TP as shown in FIG. 2 based on the test start signal $S_{st2}$, thereby the test of the DUT 100 is executed.

The temperature control after starting the test of the DUT 100 is performed as follows. First, after the test of the DUT 100 is started, the first transmitter 11 transmits a first signal $S_1$ indicating the detected value of the temperature detection circuit 102 (the output voltage V(t) of the thermal diode) to the first receiver 91. The first receiver 91 outputs a first signal $S_1$ to the first calculator 94. Each time the first calculator 94 receives the first signal $S_1$, it calculates the calculated temperature T(t) based on the output voltage V(t) of the thermal diode, and outputs a signal indicating the calculated temperature T(t) to the calibrator 95.

The second control portion 14 of the tester 10 transmits the first pre-trigger signal $S_{PT1}$ to the second transmitter 12 based on the external output trigger signal X after the test of the DUT 100 is started and before the test A (see FIG. 2) is executed. The second transmitter 12 transmits the received first pre-trigger signal $S_{PT1}$ to the second receiver 92 of the handler 50. The second receiver 92 transmits the received first pre-trigger signal $S_{PT1}$ to the calibrator 95.

The calibrator 95 calculates the first calibrated temperature T'(t) by executing the first calibration based on the above formulas (6) and (7) with respect to the calculated temperature T(t) from the time when the second receiver 92 receives the first pre-trigger signal Sm. This first calibrating corrects the first error and calibrates the calculated temperature T(t). Then, the calibrator 95 transmits signals indicating the first calibrated temperature T'(t) to the temperature control portion 96. The second control portion 14 may transmit the first pre-trigger signal $S_{PT1}$ at the same time as the test of the DUT 100 starts.

After the test of the DUT 100 is started, the temperature control portion 96 starts the temperature control based on the first calibrated temperature T'(t) calculated as described above. In this temperature control, the temperature of the DUT 100 is adjusted by the thermostatic chamber 60 so that the difference between the first calibrated temperature T'(t) and the setpoint $T_{SP}$ which is target temperature is minimized.

After the temperature control based on the first calibrated temperature T'(t) is started by the temperature control portion 96, the test A (see FIG. 2) including the connection test and the like is executed by the second control portion 14. As shown in FIG. 2, after the test A is completed, the second control portion 14 turns on the DUT 100.

After turning on the DUT 100, the second control portion 14 transmits the second pre-trigger signal $S_{PT2}$ to the third transmitter 13 based on the external output trigger signal Y. The third transmitter 13 transmits the received second pre-trigger signal $S_{PT2}$ to the third receiver 93 of the handler 50. Then, the third receiver 93 transmits the received second pre-trigger signal $S_{PT2}$ to the calibrator 95. The calibrator 95 calculates the second calibrated temperature T"(t) by executing the second calibration based on the above formulas (8) to (10) with respect to the calculated temperature T(t) from the time when the second receiver 92 receives the second pre-trigger signal $S_{PT2}$. This second calibration corrects the second error and recalibrates calculated temperature T(t). Then, the calibrator 95 transmits signals indicating the second calibrated temperature T"(t) to the temperature control portion 96.

The temperature control portion 96 starts the temperature control based on the second calibrated temperature T"(t) calculated as described above. In this temperature control, the temperature of the DUT 100 is adjusted by the thermostatic chamber 60 so that the difference between the second calibrated temperature T"(t) and the setpoint $T_{SP}$ which is target temperature is minimized. The temperature control based on this second calibrated temperature T"(t) is continued until the test of the DUT 100 is completed.

As described above, in the present embodiment, since the calculated temperature T(t) obtained by the first calculator 94 during the test of the DUT 100 is calibrated by the calibrator 95, the trimming process is not necessary.

In addition, in the present embodiment, since the first and second calibrations are executed by the test program TP, the handler 50 can execute the first calibrating and the second calibration, respectively, for all DUTs 100. Therefore, it is possible to eliminate all of the trimming processes that have been conventionally performed for each DUT 100.

The Second Embodiment

Figure 4:
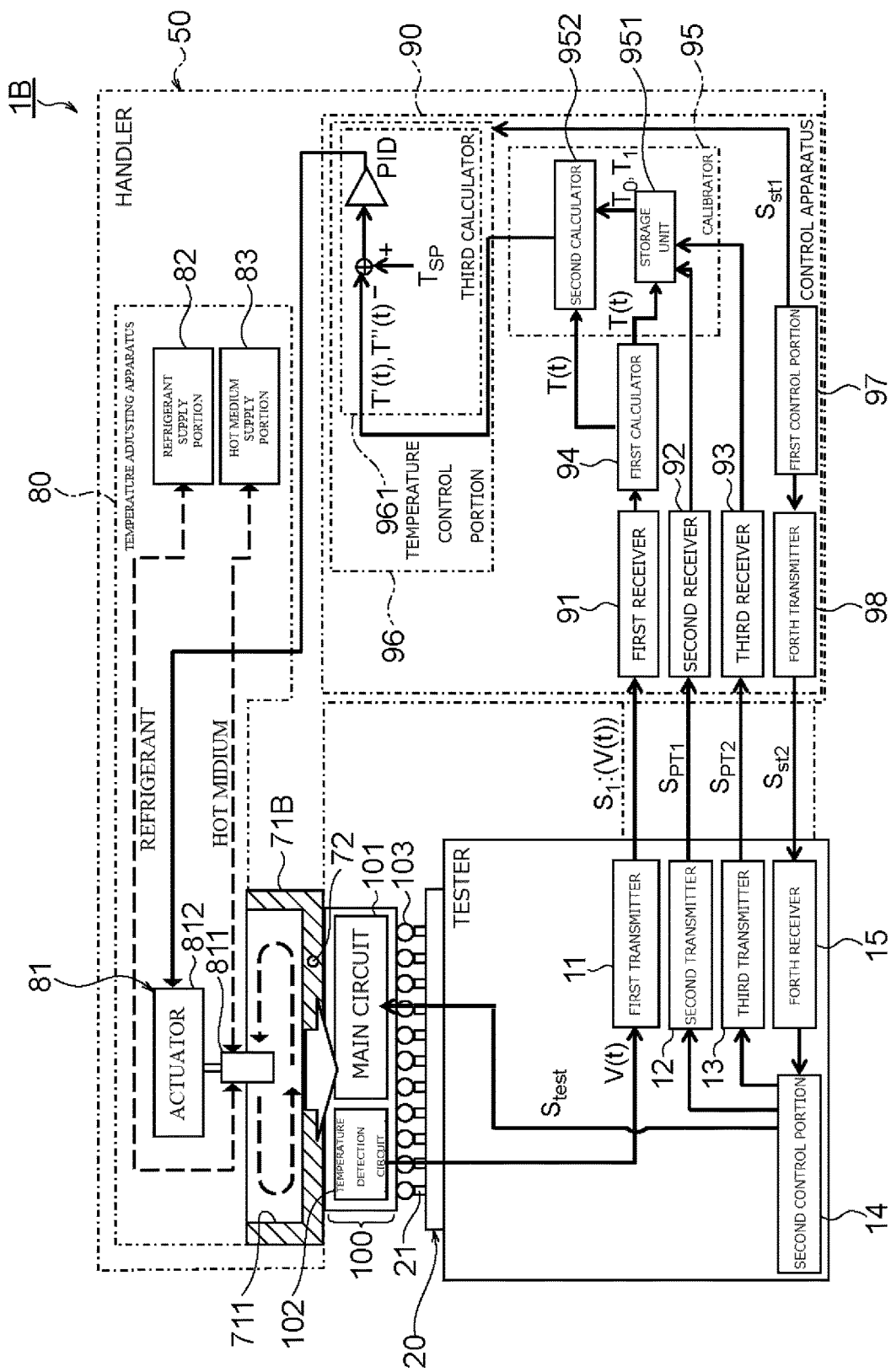
FIG. 4 is a block diagram illustrating a configuration of an electronic component testing apparatus in a second embodiment of the present invention.

FIG. 4 is a block diagram illustrating a configuration of an electronic component testing apparatus in a second embodiment. The present embodiment differs from the first embodiment in that the temperature of the DUT 100 is adjusted by controlling a temperature of pusher 71B instead of the thermostatic chamber 60, but the other configuration is the same as the first embodiment. Hereinafter, only differences from the first embodiment in the second embodiment will be described, and descriptions of portions having the same configuration as the first embodiment will be omitted.

As shown in FIG. 4, the handler 50B of the electronic component testing apparatus 1B is provided with a temperature adjusting apparatus 80. This temperature adjusting apparatus 80 adjusts the temperature of the DUT 100 by adjusting the temperature of the pusher 71B in the state that the pusher 71B is thermally contacted to the DUT 100.

The temperature adjusting apparatus 80 includes a flow regulating portion 81, a refrigerant supply portion 82, and a hot medium supply portion 83. An internal space 711 of pusher 71B communicates with the refrigerant supply portion 82 and the hot medium supply portion 83 through the flow regulating portion 81. Although not particularly shown, the refrigerant supply portion 82, for example, has a circulation path, a pump, and a chiller or the like. The circulation path is provided for supplying the liquid refrigerant to the internal space 711 of pusher 71 and recovering the refrigerant from the internal space 711. The pump and the chiller are provided on the circulation path. Similarly, although not particularly shown, the hot medium supply portion 83, for example, has a circulation path, a pump, and a boiler or the like. The circulation path is provided for supplying the liquid hot medium to the internal space 711 of pusher 71 and recovering the hot medium from the internal space 711. The pump and the boiler are provided on the circulation path.

The flow regulating portion 81 can optionally regulate the flow rate of the refrigerant supplied from the refrigerant supply portion 82 to the internal space 711 of pusher 71 and the flow rate of the hot medium supplied from the hot medium supply portion 83 to the internal space 711 of pusher 71 by opening and closing the valve 811. The valve 811 is coupled to an actuator 812 such as a motor, by rotating the valve 811 using the actuator 812, the opening and closing operation of the valve 811 is performed. Then, the control apparatus 90 drives the actuator 812 to adjust the flow rates of the refrigerant and the hot medium respectively in the state that the pusher 71 is in contact with the DUT 100, thereby the temperature of the DUT 100 can be adjusted.

An Example of such temperature adjusting apparatus 80 is, for example, the apparatus described in U.S. patent application Ser. No. 12/742,178 (U.S. Patent Application Publication No. 2011/0126931). The configuration of the temperature adjuster is not particularly limited to the above. For example, instead of the valve 811 and the actuator 812, the flow rates of the refrigerant and the hot medium may be adjusted by using solenoid valves, respectively. An example of the temperature adjuster with such a configuration is, for example, the apparatus described in U.S. patent application Ser. No. 14/472,398 (U.S. Patent Application Publication No. 2015/0268295). Alternatively, a thermostreamer, a heater, and the like using gas as the refrigerant and the hot medium may be used as temperature adjuster.

Further, a temperature sensor 72 is buried in pusher 71B. The temperature sensor 72 can measure the temperature of the DUT 100 via pusher 71B. When adjusting the temperature of pusher 71B to a set point before the test of the DUT 100 start, the temperature control portion 96 may control the temperature adjusting apparatus 80 based on the detected value of the temperature sensor 72.

By adjusting the temperature of the DUT 100 for a predetermined time prior to starting the test with the temperature adjusting apparatus 80 as described above, the temperature of the DUT 100 can be adjusted to the set point $T_{sp}$. In this case, the set point $T_{sp}$ can be used as the reference temperature $T_{ref}$ shown in the formulas (6) and (8) as in the first embodiment.

Alternatively, when the temperature of the DUT 100 and the temperature of pusher 71B is the same, it is also possible to use the temperature detected by the temperature sensor 72 as the reference temperature. For example, when the temperature is applied to the DUT 100 by the pusher 71B after contacting the DUT 100 with the pusher 71B at a normal temperature, the normal temperature (the temperature of the DUT 100 when contacting the pusher 71B) may be used as the reference temperature $T_{ref}$.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, in the above embodiments, using the output voltage of the thermal diode of temperature detection circuit 102, but is not limited to this. The temperature of the DUT 100 may be calculated based on the temperature characteristic of the output voltage of the ESD diode for electrostatic protection. Instead of the output voltage of the diode, the temperature of the DUT 100 may be calculated based on the temperature characteristic of the voltage or current of the thermal noise of the resistor.

Although the disclosure has been described with respect to only a limited number of embodiments, those skilled in the art, having benefit of this disclosure, will appreciate that various other embodiments may be devised without departing from the scope of the present disclosure. Accordingly, the scope of the invention should be limited only by the attached claims.

EXPLANATIONS OF LETTERS OR NUMERALS 1,1B: Electronic component testing apparatus
       10 . . . Tester
          11~13 . . . First to third transmitter
          14 . . . Second control portion
          15 . . . Fourth receiver
       20 . . . Socket
          21 . . . Contacts
       30 . . . Cable
       50, 50B . . . handler
       60 . . . Thermostatic chamber
          61 . . . Chamber portion
          62 . . . Temperature adjusting portion
       70 . . . Contact arm
       71,71B . . . Pusher
          711 . . . Internal space
          72 . . . Temperature sensor 80 . . . Temperature adjusting apparatus
  81 . . . Flow regulating portion
    811 . . . Valve
    812 . . . Actuator
  82 . . . Refrigerant supply portion
  83 . . . Hot medium supply portion
90 . . . Control apparatus
  91~93 . . . First to third receiver
  94 . . . First calculator
  95 . . . Calibrator
    951 . . . Storage unit
    952 . . . Second calculator
  96 . . . Temperature control portion
    961 . . . Third calculator
  97 . . . First control portion
  98 . . . Fourth transmitter
100 . . . DUT
  101 . . . Main circuit
  102 . . . Temperature detection circuit
  103 . . . Input and output terminals

The invention claimed is:

1. An electronic component handling apparatus for handling a device under test (DUT) and pressing the DUT against a socket electrically connected to a tester testing the DUT, the electronic component handling apparatus comprising:
   a first receiver that receives, from the tester, a first signal indicating a detection value of a temperature detection circuit of the DUT;
   a calculator that calculates a temperature of the DUT based on the first signal and obtains a calculated temperature;
   a calibrator that calibrates the calculated temperature;
   a second receiver that receives, from the tester, a second signal that causes the calibrator to start a first calibration; and
   a temperature adjuster that adjusts the temperature of the DUT, wherein
   the second receiver receives the second signal before the tester turns on the DUT,
   once the second receiver receives the second signal, the calibrator calculates a first calibrated temperature by executing the first calibration with respect to the calculated temperature, and
   the temperature adjuster adjusts the temperature of the DUT based on the first calibrated temperature.

2. The electronic component handling apparatus according to claim 1, further comprising:
   a third receiver that receives, from the tester, a third signal that causes the calibrator to start a second calibration that is different from the first calibration, wherein
   the third receiver receives the third signal immediately after the tester turns on the DUT,
   once the third receiver receives the third signal, the calibrator calculates a second calibrated temperature by executing the second calibration with respect to the calculated temperature, and
   the temperature adjuster adjusts the temperature of the DUT based on the second calibrated temperature.

3. The electronic component handling apparatus according to claim 1, wherein
   the temperature adjuster adjusts the temperature of the DUT such that the temperature of the DUT becomes a target temperature before the second receiver receives the second signal.

4. The electronic component handling apparatus according to claim 1, wherein
   the temperature detection circuit includes a diode.

5. The electronic component handling apparatus according to claim 1, wherein
   the electronic component handling apparatus sequentially supplies device under tests (DUTs) to the socket, and
   the calibrator executes the first calibration for all the DUTs.

6. The electronic component handling apparatus according to claim 2, wherein
   the electronic component handling apparatus sequentially supplies device under tests (DUTs) to the socket, and
   the calibrator executes the first and second calibrations for all the DUTs.

7. The electronic component handling apparatus according to claim 1, wherein
   the calibrator further comprises:
     a storage that stores the calculated temperature,
   the calculated temperature includes a calculated temperature at which the second receiver receives the second signal, and
   the calibrator executes the first calibration based on the calculated temperature at which the second receiver receives the second signal.

8. The electronic component handling apparatus according to claim 2, wherein
   the calibrator further comprises:
     a storage that stores the calculated temperature,
   the calculated temperature includes a calculated temperature at which the second receiver receives the second signal,
   the calibrator executes the first calibration based on the calculated temperature at which the second receiver receives the second signal,
   the calculated temperature further includes a calculated temperature at which the third receiver receives the third signal, and
   the calibrator executes the second calibration based on the calculated temperature at which the third receiver receives the third signal.

9. The electronic component handling apparatus according to claim 1,
   the temperature adjuster is a thermostatic chamber configured to accommodate the DUT and adjust an inner temperature,
   the temperature adjuster adjusts the inner temperature such that the temperature of the DUT reaches a set point before the second receiver receives the second signal, and
   the set point is a target temperature of the DUT under a test.

10. The electronic component handling apparatus according to claim 1, further comprising:
    a contact arm that brings the DUT into contact with the socket;
    a pusher that is disposed on a tip end of the contact arm and presses the DUT against the socket; and
    a temperature sensor that is disposed in the pusher and measures the temperature of the DUT through the pusher, wherein
    the temperature adjuster adjusts the temperature of the DUT by adjusting a temperature of the pusher.

11. The electronic component handling apparatus according to claim 7,
the first calibration is executed based on following formulas (1) and (2):

$$T'(t) = T_{ref} + \Delta T_1 \quad (1)$$

$$\Delta T_1 = T(t) - T_0 \quad (2)$$

where
T'(t) is the first calibrated temperature,
Tref is a reference temperature,
T(t) is the calculated temperature in t second from a time that the second receiver receives the second signal, and
T0 is the calculated temperature calculated by the calculator when the second receiver receives the second signal.

12. The electronic component handling apparatus according to claim 8,
the second calibration is executed based on following formulas (3) to (5):

$$T''(t) = T\text{ref} + \Delta T1 + \Delta T2 \quad (3)$$

$$\Delta T1 = T(t) - T0 \quad (4)$$

$$\Delta T2 = T0 - T1 \quad (5)$$

where
T"(t) is the second calibrated temperature,
$T_{ref}$ is a reference temperature,
T(t) is the calculated temperature in t second from a time that the second receiver receives the second signal,
$T_0$ is the calculated temperature calculated by the calculator when the second receiver receives the second signal, and
$T_1$ is the calculated temperature calculated by the calculator when the third receiver receives the third signal.

13. An electronic component testing apparatus comprising:
the electronic component handling apparatus according to claim 1; and
the tester testing the DUT, wherein
the tester comprises:
a first transmitter that transmits the first signal; and
a second transmitter that transmits the second signal before the DUT is turned on.

14. An electronic component testing apparatus comprising:
the electronic component handling apparatus according to claim 2; and
the tester testing the DUT, wherein
the tester comprises:
a first transmitter that transmits the first signal;
a second transmitter that transmits the second signal before the DUT is turned on; and
a third transmitter that transmits the third signal immediately after the DUT is turned on.

15. An electronic component testing method for testing a device under test (DUT) by a tester, the electronic component testing method comprising:
calculating a temperature of the DUT based on a detection value of a temperature detection circuit of the DUT and obtaining a calculated temperature;
calculating a first calibrated temperature by executing a first calibration with respect to the calculated temperature before the tester turns on the DUT; and
adjusting the temperature of the DUT based on the first calibrated temperature.

16. The electronic component testing method according to claim 15, further comprising:
calculating a second calibrated temperature by executing a second calibration with respect to the calculated temperature immediately after the tester turns on the DUT, the second calibration being different from the first calibration; and
adjusting the temperature of the DUT based on the second calibrated temperature.

* * * * *